(12) United States Patent
Berry et al.

(10) Patent No.: US 8,907,742 B2
(45) Date of Patent: Dec. 9, 2014

(54) ELECTROSTATIC DISCHARGE CONTROL FOR A MULTI-CAVITY MICROWAVE FILTER

(75) Inventors: Stephen D. Berry, San Ramon, CA (US); Stephen C. Holme, San Ramon, CA (US); Slawomir J. Fiedziuszko, Palo Alto, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 313 days.

(21) Appl. No.: 13/442,252

(22) Filed: Apr. 9, 2012

(65) Prior Publication Data
US 2013/0265119 A1   Oct. 10, 2013

(51) Int. Cl.
H01P 1/213        (2006.01)
H03H 7/46         (2006.01)

(52) U.S. Cl.
CPC ............. *H01P 1/2136* (2013.01); *H03H 7/463* (2013.01)
USPC ............................ 333/134; 333/212; 333/202

(58) Field of Classification Search
CPC ...... H01P 1/3236; H01P 1/2056; H03H 7/463
USPC .......................................................... 333/134
See application file for complete search history.

(56) References Cited

U.S. PATENT DOCUMENTS

| | | | |
|---|---|---|---|
| 5,608,363 A | 3/1997 | Cameron et al. | |
| 6,239,673 B1 * | 5/2001 | Wenzel et al. | 333/202 |
| 6,882,251 B2 | 4/2005 | Yu et al. | |
| 2007/0057747 A1 * | 3/2007 | Kubo et al. | 333/134 |

OTHER PUBLICATIONS

Hunter et al., "Microwave Filter Design from a Systems Perspective," IEEE Microwave Magazine, Oct. 2007.
NASA-HDBK-4002, "Mitigating In-Space Charging Effects—A Guideline".
Wang et al., "Dielectric Resonators and Filters," IEEE Microwave Magazine, Oct. 2007.
Yu et al., "Shrinking Microwave Filters," IEEE Microwave Magazine, Oct. 2008.

* cited by examiner

*Primary Examiner* — Stephen Jones
*Assistant Examiner* — Scott S Outten
(74) *Attorney, Agent, or Firm* — Weaver Austin Villeneuve & Sampson LLP (57) ABSTRACT

A multi-cavity RF filter has at least one electrically conductive coupling probe disposed between two resonator cavities. The coupling probe is provided with an ESD protective arrangement such that the coupling probe is electrically connected to a metallic housing of the RF filter only by the ESD protective arrangement. The ESD protective arrangement is configured to provide (i) a low resistance electrical path from the coupling probe to the metallic housing and (ii) a high impedance to RF energy having wavelengths proximate to a center frequency wavelength of the RF filter.

25 Claims, 9 Drawing Sheets

ELECTROSTATIC DISCHARGE CONTROL FOR A MULTI-CAVITY MICROWAVE FILTER

TECHNICAL FIELD

This invention relates generally to a multi-cavity microwave filter, and particularly to coupling probes for a multi-cavity microwave filter that are configured to have electrostatic discharge (ESD) protection.

BACKGROUND OF THE INVENTION

The assignee of the present invention manufactures and deploys spacecraft for, inter alia, communications and broadcast services from geosynchronous orbit. A substantial number of radio frequency (RF) filters are required in such spacecraft. For example, a satellite input multiplexor may utilize a number of such filters, each filter having the functionality of separating and isolating a specific respective signal or frequency bandwidth from a broadband uplink signal received by a spacecraft antenna.

A known type of RF filter is a multi-cavity microwave filter having a unitary housing. Each cavity in such a filter may include a dielectric resonator, for example, as described by Cameron, et al., U.S. Pat. No. 5,608,363, or a post, for example, as described by Yu, U.S. Pat. No. 6,882,251, the disclosures of which are hereby incorporated in their entirety into the present application.

Figure 1A:
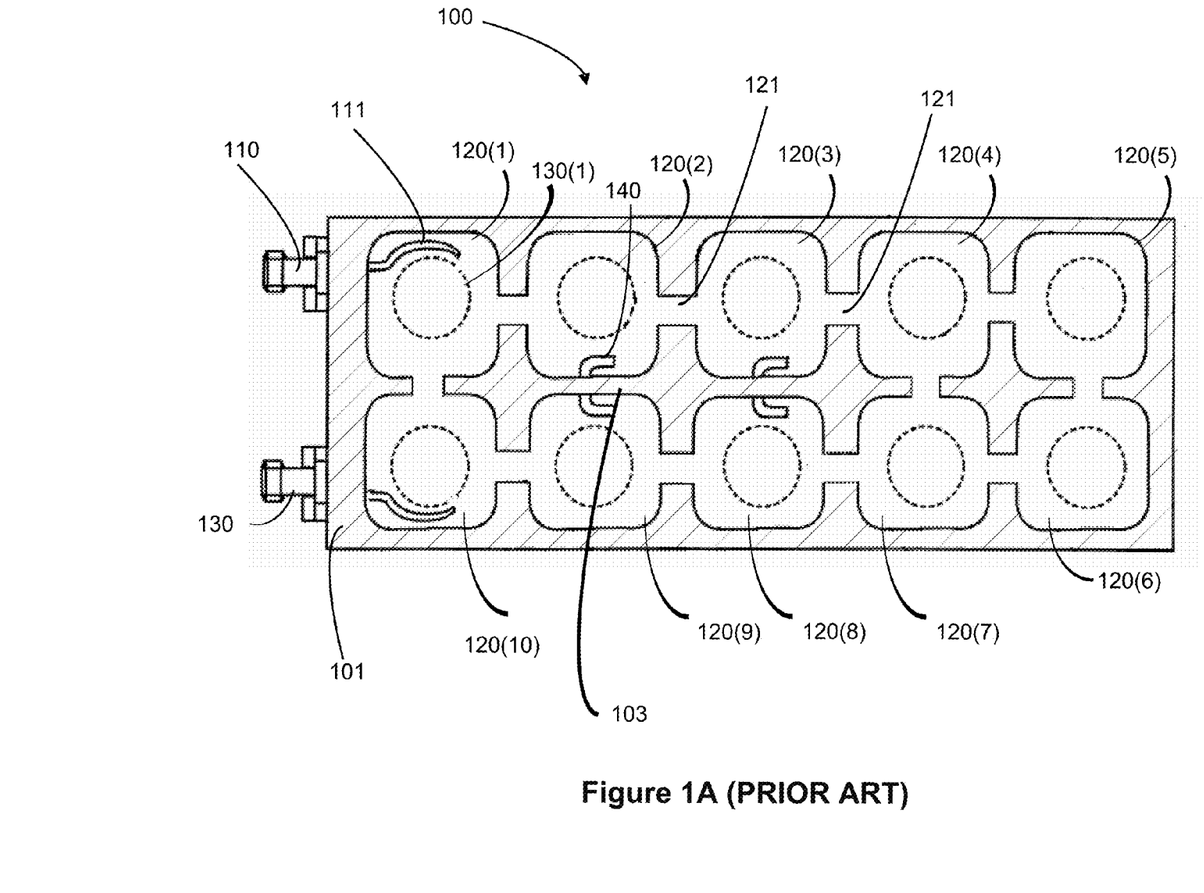
FIG. 1A shows an RF filter according to the prior art.

FIG. 1A shows an RF filter of the type described by Cameron and Yu. As illustrated in FIG. 1A, RF filter 100 may include a metallic housing 101, in which a number of resonator cavities 120 are formed. Metallic housing 101 is made from an electrically conductive material, such as aluminum. An input port 110 is coupled by probe 111 to a first resonator cavity 120(1). Resonator cavity 120(1) contains an associated dielectric resonator 130(1) and may therefore be referred to as a "loaded" cavity. Alternatively, resonator cavity 120(1) may contain a centrally disposed cylinder (not shown) and be referred to as a coaxial resonator. A sequential series of such resonator cavities 120 may be provided, where the first resonator cavity in the series, 120(1) is proximate to input port 110, and the last resonator cavity in the series, resonator cavity 120(10), is proximate to output port 130. The series of resonator cavities may be arranged, as illustrated, in two rows, such that some non-sequential resonator cavities (for example, 120(2) and 120(9)) are physically adjacent to one another and separated by metal wall 103 of metallic housing 101. Sequential resonator cavities (for example, 120(2) and 120(3)) may be coupled by openings, irises or "slots" 121. Slot couplings 121 are magnetic field-to-magnetic field couplings that may be referred to as "positive couplings".

Some resonator cavities may be provided with "negative couplings", and/or positive couplings, by way of electrically conductive coupling probes (hereinafter, "coupling probes"). For example, resonator cavities 120(2) and 120(9) are illustrated as being coupled by coupling probe 140.

Figure 1B:
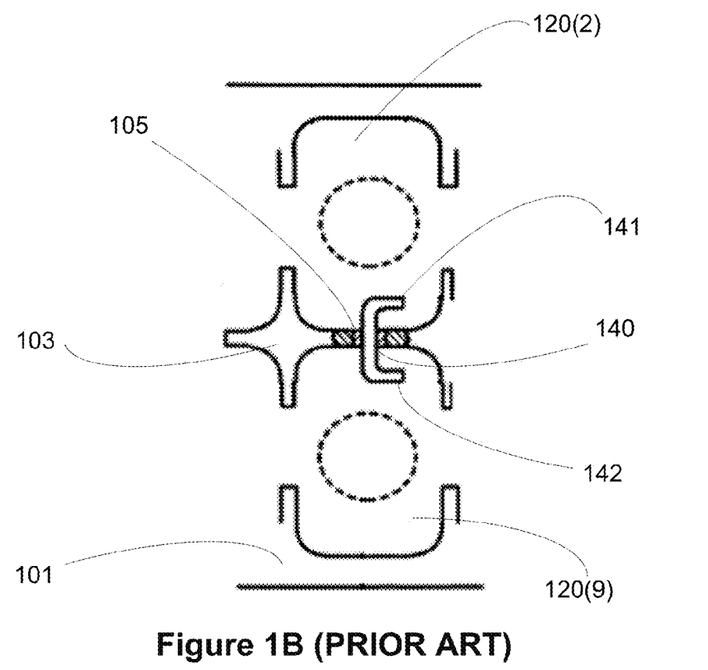
FIG. 1B shows a partial top view of the RF filter illustrated in FIG. 1A, according to the prior art.

Referring now to FIG. 1B, it may be observed that a conventional coupling probe 140 extends through an aperture in metal wall 103 of metallic housing 101. Coupling probe 140 includes first probe end 141 and second probe end 142. First probe end 141 extends into resonator cavity 120(2) of RF filter 100 while second probe end 142 extends into resonator cavity 120(9). In this configuration, coupling probe 140 is capable of providing an energy coupling between resonator cavities 120(2) and 120(9).

Figure 1C:
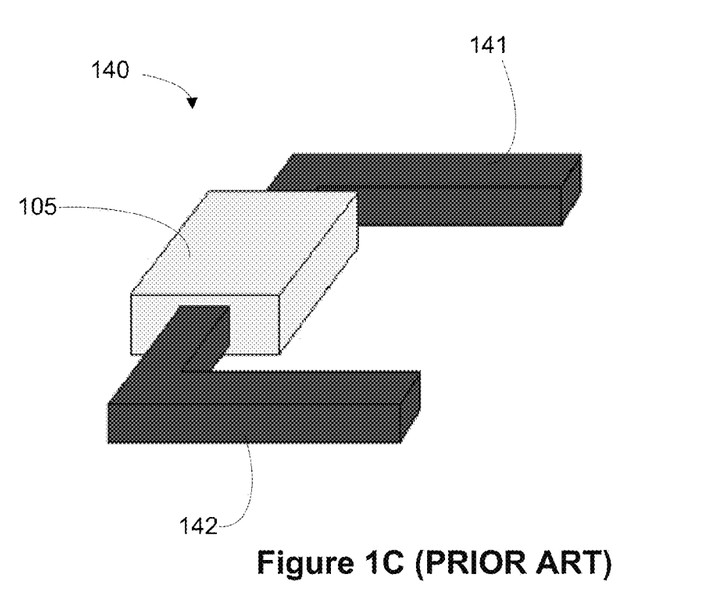
FIG. 1C shows a coupling probe according to the prior art.

Conventionally, an insulating material 105 surrounds a portion of coupling probe 140, as shown in FIG. 1C. Insulating material 105 provides a structural interface between coupling probe 140 and metal wall 103 of metallic housing 101, as well as electrically isolating coupling probe 140 from metal wall 103. As a result of the above-described arrangement, coupling probe 140 "floats" electrically with respect to metallic housing 101.

In a typical communications satellite, space charging phenomena may cause an internal charge buildup on coupling probes that is caused primarily by electrons with energies oscillating between 1 and 50 Kev during, for example, solar ion storms. When charge buildup exceeds a critical value, electrostatic discharge (ESD) events may occur, that represent significant potential threats to sensitive satellite components such as low noise amplifiers, other payload equipment, and spacecraft bus electronics. NASA design guidelines (for example, NASA-HDBK-4002, February 1999) recommend avoidance of "floating conductor" configurations in ESD sensitive components. Some satellite operators prohibit "floating conductors" in general.

SUMMARY OF INVENTION

The present inventors have appreciated that where electrically conductive coupling probes are provided between cavities of a multi-cavity RF filter, the coupling probes may be provided with an ESD protective arrangement such that the coupling probe is electrically connected to a metallic housing of the RF filter only by the ESD protective arrangement. The ESD protective arrangement is configured to provide (i) a low resistance electrical path from the coupling probe to the metallic housing and (ii) a high impedance to RF energy having wavelengths proximate to a center frequency wavelength of the RF filter.

In an embodiment, a radio frequency (RF) filter, configured to output RF energy at a center frequency wavelength $\lambda$, includes a multi-cavity metallic housing and at least one electrically conducting probe. The housing includes a plurality of walls that define a plurality of resonator cavities, the walls between adjacent sequential resonator cavities having openings configured to couple adjacent sequential resonator cavities. The electrically conductive coupling probe is disposed through an aperture of a wall between a first resonator cavity and a second resonator cavity, the coupling probe having opposite probe ends comprising a first probe end extending into the first resonator cavity and a second probe end extending into the second resonator cavity so as to couple RF energy therebetween. The coupling probe is electrically coupled to the metallic housing only by an electrostatic discharge (ESD) protective arrangement, the ESD protective arrangement being configured to provide (i) a low resistance electrical path from the coupling probe to the metallic housing and (ii) a high impedance to RF energy having wavelengths proximate to $\lambda$.

In a further embodiment, an electrical insulator may separate the coupling probe from the wall proximate to the aperture.

In another embodiment, the ESD protective arrangement may include an electrically conductive post having a first end and a second end, the electrically conductive post being electrically connected, proximate to the first end, to the coupling probe, and electrically connected, proximate to the second end, to the metallic housing. A distance 'd' between the coupling probe and the metallic housing may be approximately $\lambda/4 + \lambda \cdot n/2$, wherein n is a positive integer or zero. A longitudinal axis of each dielectric resonator may be substantially parallel to a longitudinal axis of the post. The first probe end and the second probe end may each be disposed in a plane substantially orthogonal to the longitudinal axis of the post. The second end of the post may be mechanically attached to an external wall of the metallic housing. One or each of the first probe end and the second probe end may be substantially 'L'-shaped or curved. The first resonator cavity and the second resonator cavity may be adjacent and non-sequential. The first resonator cavity and the second resonator cavity may be contiguous, non-adjacent, and non-sequential.

In an embodiment, 'n' is zero.

In another embodiment, the ESD protective arrangement further includes an adjusting device configured to enable adjusting, from the exterior of the metallic housing, one or both of an orientation of the coupling probe and the distance 'd'.

In an embodiment, the coupling probe may be configured to provide a positive coupling between the first resonator cavity and the second resonator cavity. The coupling probe may be configured to provide a negative coupling between the first resonator cavity and the second resonator cavity.

In an embodiment at least one of the plurality of resonator cavities may include a dielectric resonator.

In another embodiment, at least one of the plurality of resonator cavities may be configured as a coaxial resonator.

In a yet further embodiment, a multiplexer includes at least two channel filters. The multiplexer may be configured to channelize an input radio frequency (RF) band of electromagnetic energy into a set of output channels by way of the channel filters, each output channel configured to output RF energy at a respective wavelength $\lambda_i$; At least one output filter may include a multi-cavity metallic housing, and at least one electrically conductive coupling probe. The housing may include a plurality of walls that define a plurality of resonator cavities. The walls between adjacent sequential resonator cavities may have openings configured to couple adjacent sequential resonator cavities. The electrically conductive coupling probe may be disposed through an aperture of a wall between a first of the resonator cavities and a second of the resonator cavities, the coupling probe having opposite probe ends comprising a first probe end extending into the first resonator cavity and a second probe end extending into the second resonator cavity so as to couple RF energy therebetween. The coupling probe may be electrically coupled to the metallic housing only by an electrostatic discharge (ESD) protective arrangement, the ESD protective arrangement being configured to provide (i) a low resistance electrical path from the coupling probe to the metallic housing and (ii) a high impedance to RF energy having wavelengths proximate to '$\lambda$'.

BRIEF DESCRIPTION OF THE DRAWINGS

The included drawings are for illustrative purposes and serve only to provide examples of possible structures for the disclosed inventive filters and multiplexers. These drawings in no way limit any changes in form and detail that may be made by one skilled in the art without departing from the spirit and scope of the disclosed embodiments.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. Furthermore, "connected" or "coupled" as used herein may include wirelessly connected or coupled. It will be understood that although the terms "first" and "second" are used herein to describe various elements, these elements should not be limited by these terms. These terms are used only to distinguish one element from another element. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

The present inventors have appreciated that, where electrically conductive coupling probes are provided between cavities of a multi-cavity RF filter, the coupling probes may be provided with an ESD protective arrangement such that the coupling probe is electrically connected to a metallic housing of the RF filter only by the ESD protective arrangement. The ESD protective arrangement may be configured to provide (i) a low resistance electrical path from the coupling probe to the metallic housing, and (ii) a high impedance to RF energy having wavelengths proximate to a center frequency wavelength of the RF filter.

The ESD protective arrangement may include an electrically conductive post having a first end and a second end, the electrically conductive post being electrically connected at the first end to the coupling probe, and electrically connected at the second end to the metallic housing, such that a distance 'd' between the coupling probe and the metallic housing is approximately $\lambda/4+\lambda*n/2$, wherein n is a positive integer or zero. In some embodiments, advantageously, the ESD protective arrangement may include an adjusting device configured such that, from outside the metallic housing of the RF filter, an orientation of the coupling probe and/or the distance 'd' may be adjusted.

Figure 2:
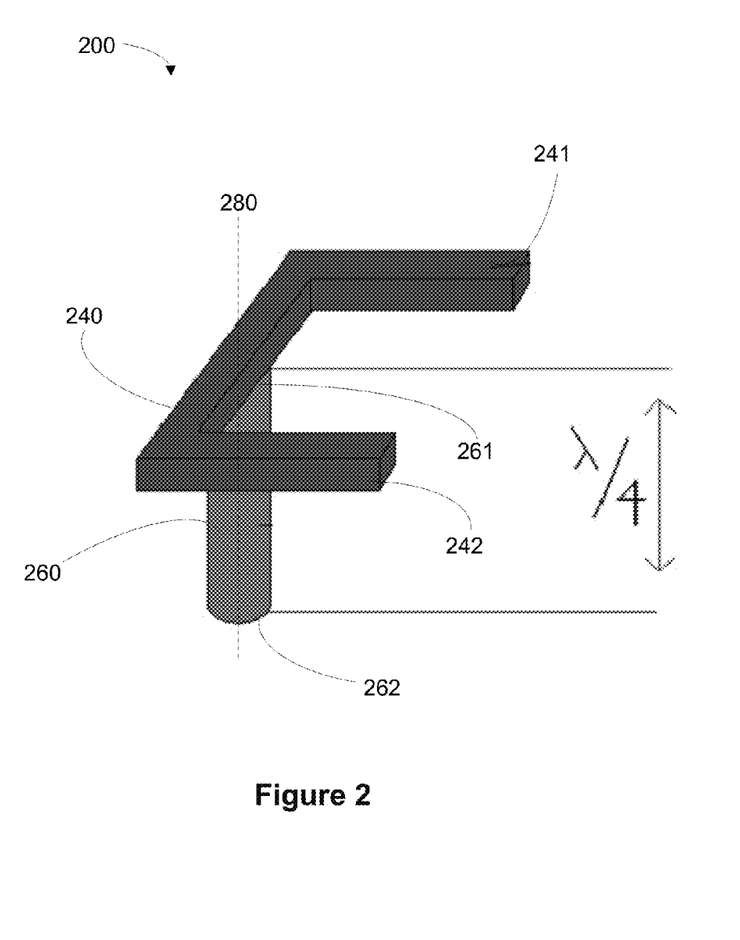
FIG. 2 shows an example of a coupling probe configured to have ESD protection in accordance with some embodiments.

FIG. 2 shows an example of a coupling probe configured to have ESD protection. In the illustrated embodiment, arrangement 200 includes coupling probe 240 and electrically conductive post (or "post") 260. Coupling probe 240 may include first probe end 241 and second probe end 242. Coupling probe 240 may be electrically connected to post 260. As illustrated, first probe end 241 and second probe end 242 may be disposed in a plane substantially orthogonal to longitudinal axis 280 of post 260. As illustrated, post 260 may include first end 261 and second end 262. First end 261 may be conductively coupled with coupling probe 240, creating an electrical contact between post 260 and coupling probe 240. As described in more detail herein below, second end 261 may be conductively coupled with a metallic housing of an RF filter, such that post 260 provides a low resistance electrical path from coupling probe 240 to the metallic housing (not illustrated) and (ii) a high impedance to RF energy having wavelengths proximate to a center frequency wavelength of the RF filter.

Figure 3A:
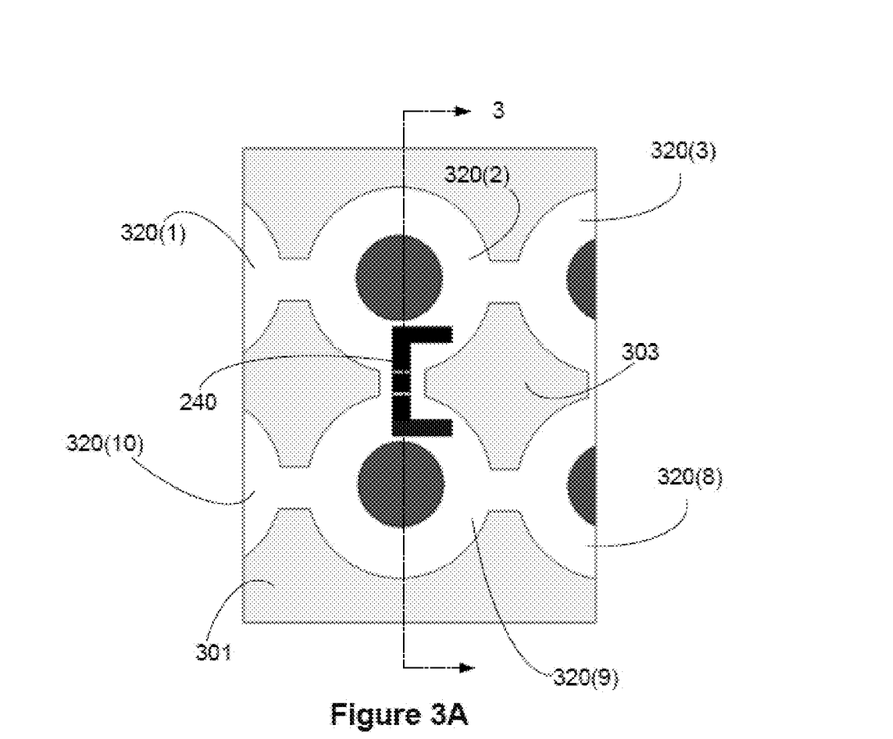
FIG. 3A shows an example of a partial top view of an RF filter, configured in accordance with some embodiments.

FIG. 3A shows an example of a partial top view of an RF filter, configured in accordance with some embodiments. The RF filter may be configured to separate, isolate, and output an RF energy signal at a center frequency wavelength 'λ'. The RF filter includes resonator cavity 320(2) and resonator cavity 320(9). In the illustrated embodiment, resonator cavity 320(2) is adjacent to and non-sequential with resonator cavity 320(9).

It will be appreciated that, while resonator cavities 320(2) and 320(9) are shown in the examples in FIGS. 3A, 4A, 4B, 5A, 5B, 7A and 7B, the following discussion may be applicable to any two resonator cavities that are coupled by a coupling probe. As illustrated in FIG. 3A, a pair of resonator cavities coupled by a coupling probe may be non-sequential and adjacent within the RF filter, such as resonator cavities 320(2) and 320(9). As another example, a pair of resonator cavities may be contiguous, non-sequential and non-adjacent, such as resonator cavities 320(9) and 320(3). In yet another example, the two resonator cavities may be sequential and contiguous, such as resonator cavities 320(2) and 320(3).

Figure 3B:
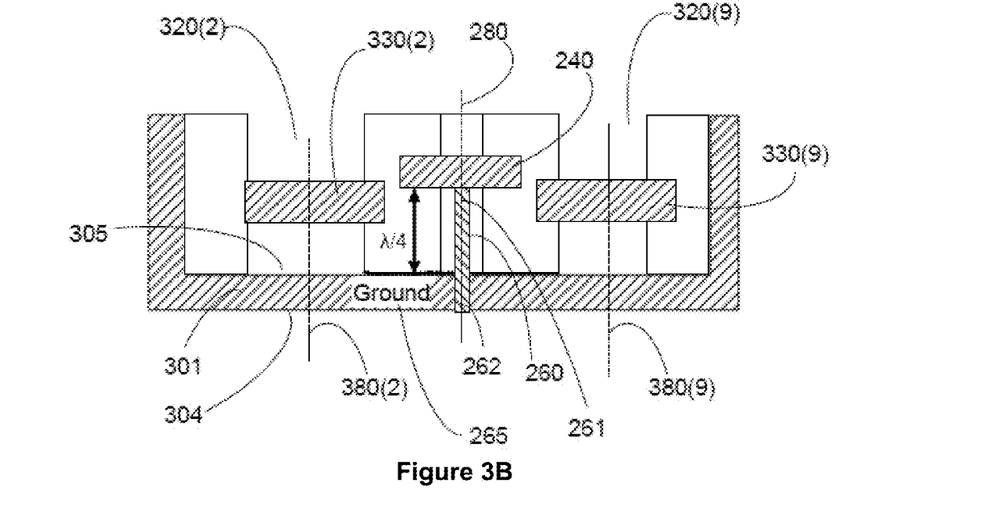
FIG. 3B shows an example of a cross sectional view of the RF filter illustrated in FIG. 3A.

FIG. 3B shows an example of a cross sectional view of the RF filter depicted in FIG. 3A, taken along line 3 in FIG. 3A looking in the direction of the arrows, configured in accordance with some embodiments. Advantageously, coupling probe 240 may be electrically connected with metallic housing 301 only by post 260. In the illustrated example, second end 262 of post 260 is mechanically attached to external wall 304 of metallic housing 301. In some embodiments, post 260 may be disposed such that longitudinal axis 280 of post 260 is substantially parallel to longitudinal axes 380(2) and 380(9) of dielectric resonators 330(2) and 330(9), respectively. Although omitted for clarity, one or more electrical insulators, advantageously, isolate coupling probe 240 from the metallic housing. In one example, the vacuum of space or air may be the electrical insulator. In another example, an insulating material may be used such as polytetrafluoroethylene (PTFE, or Teflon), a polystyrene microwave plastic such as Rexolite, or a ceramic material such as boron nitride. As a result, the only electrically conductive path from coupling probe 240 to metallic housing 301 may be by way of post 260. Moreover, an electrical insulator may isolate post 260 from metallic housing 301 except at a location proximate to second end 262. For example, second end 262 may be electrically connected to metallic housing 301 only at surface 305.

Post 260 may be configured to provide (i) a low resistance electrical path from coupling probe 240 to metallic housing 301 and (ii) a high impedance to RF energy having wavelengths proximate to 'λ'. To achieve this property, as illustrated in FIG. 3B, post 260 may be configured such that a distance 'd' between coupling probe 240 and surface 305 has a length of approximately 'λ/4'. It will be appreciated that such an electrically conductive post may provide a low resistance electrical connection between coupling probe 240 and housing 301 that has a high impedance to RF frequencies near the center frequency wavelength 'λ'. Put another way, an RF signal having center frequency wavelength 'λ' carried by coupling probe 240 will see an RF open at first end 261 of post 260, while other signals having frequencies substantially away from the center frequency wavelength 'λ', including direct current (DC) signals, will see a short circuit at first end 261 of post 260. As a result, charges caused by space charging phenomenon that build up on coupling probe 240, as discussed above, may safely be conducted to metallic housing 301, which provides a ground 265 as shown in FIG. 3B. Nonetheless, RF signals having center frequency wavelength 'λ' carried by coupling probe 240 will not be affected by the presence of this conductive path.

In some embodiments, the distance 'd' may be given by the equation: $d=\lambda/4+\lambda*n/2$, where n is a positive integer or zero. It will be appreciated that, when 'd' satisfies the above equation, an RF signal having center frequency wavelength 'λ' carried by coupling probe 240 will see an RF open at first end 261 of post 260, while signals having frequencies substantially away from the center frequency wavelength λ, including direct current (DC) signals, will see a short circuit at first end 261 of post 260. It will be appreciated that the value of 'n' may be chosen based on the spatial and electrical characteristics of the RF filter. For example, 'n' may be limited by the size of the RF filter. In another example, 'n' may be chosen for ease of manufacturing or to provide a desired longitudinal distance between coupling probe 240 and housing surface 305. In addition, the selected value of 'n' may be determined in part by the center frequency of the filter. For instance, it may be desirable to use a larger 'n' value when the center frequency wavelength 'λ' of the RF filter is small.

Figure 4A:
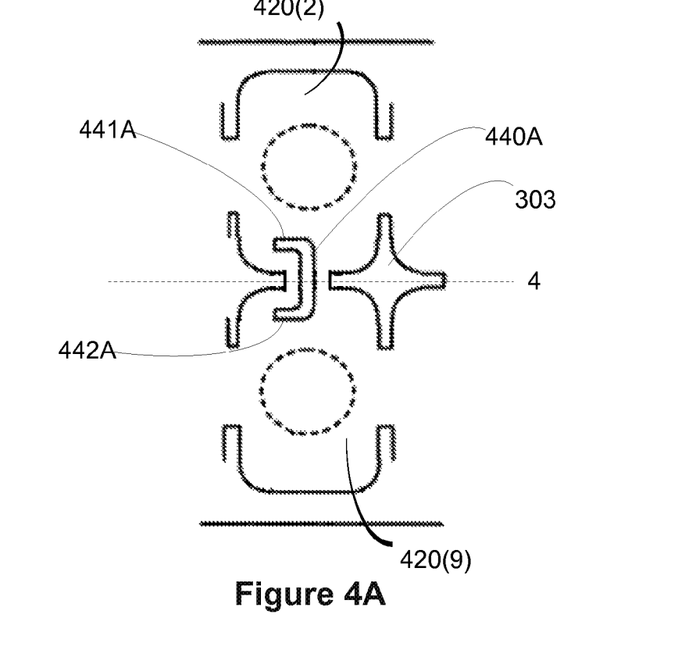
FIGS. 4A and 4B show an example of a partial top view of an RF filter including a coupling probe providing a negative coupling between two resonator cavities, configured in accordance with some embodiments.
Figure 4B:
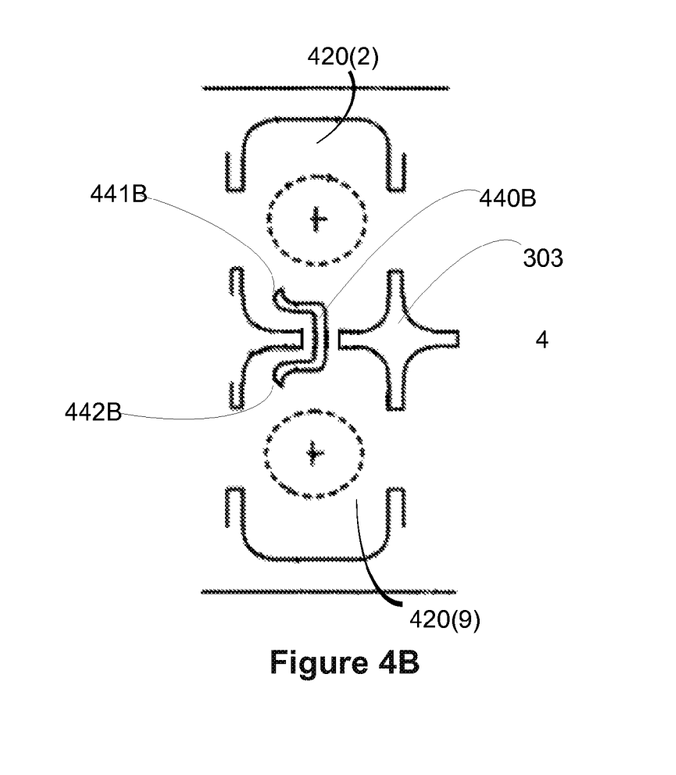

FIGS. 4A and 4B show an example of a partial top view of an RF filter, configured in accordance with some embodiments. The RF filter may be configured to separate, isolate, and output an RF energy signal at a center frequency wavelength 'λ'. The RF filter includes a first resonator cavity 420(2) and a second resonator cavity 420(9) where coupling probe 440A is configured to provide a negative coupling between resonator cavity 420(2) and resonator cavity 420(9).

Coupling probe 440A may be configured such that first probe end 441A and second probe end 442A are symmetrical with respect to a line 4 defined by wall 303 of metallic housing 301. The symmetrical probe ends that extend into resonator cavity 320(2) and resonator cavity 320(9) produce a negative coupling between resonator cavity 320(2) and resonator cavity 320(9). Probe ends 441A and 442A shown in FIG. 4A are substantially 'L' shaped, but this is not necessarily so. For example, probe ends 441B and 442B shown in FIG. 4B are curved. In some embodiments, curved probe ends 441B and 442B may be substantially parallel to a curved surface of a respective dielectric resonator. It will be understood that these example probe ends for providing a negative coupling are merely examples and that other structures may be used with similar effect.

Figure 5A:
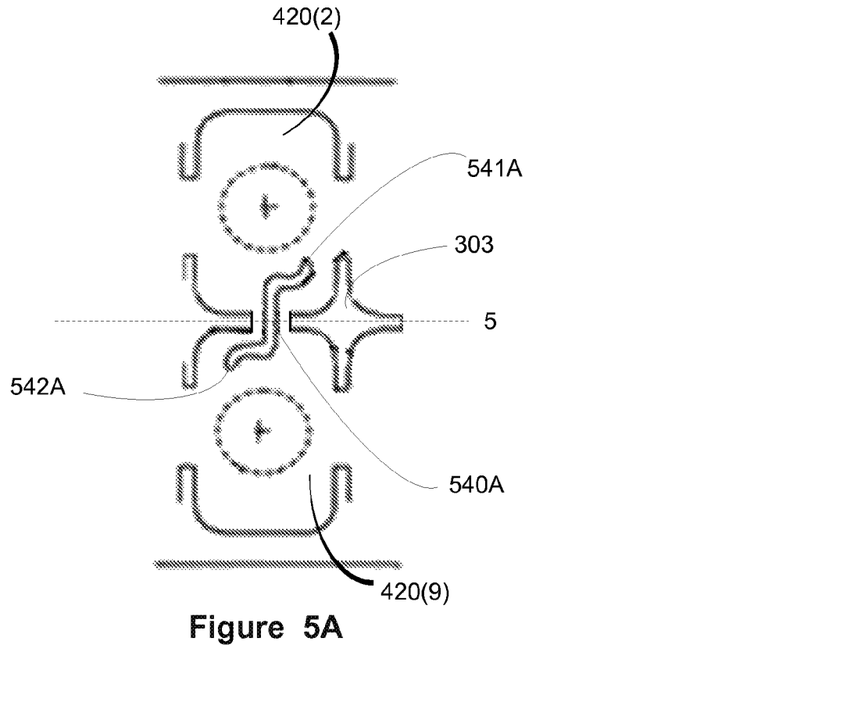
FIGS. 5A and 5B show an example of a partial top view of an RF filter including a coupling probe providing a positive coupling between two resonator cavities, configured in accordance with some embodiments.
Figure 5B:
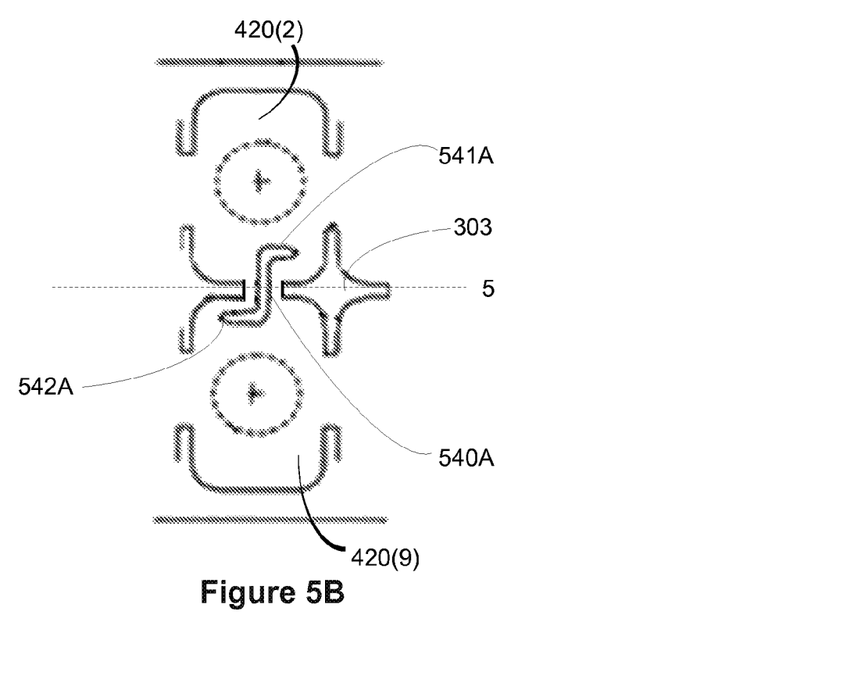

FIGS. 5A and 5B show an example of a partial top view of an RF filter, configured in accordance with some embodiments. The RF filter may be configured to separate, isolate, and output an RF energy signal at a center frequency wavelength 'λ'. The RF filter includes a first resonator cavity 320(2) and a second resonator cavity 320(9) where coupling probe 540A is configured to provide a positive coupling between resonator cavity 320(2) and resonator cavity 320(9).

Coupling probe 440A may be configured such that first probe end 441A and second probe end 442A are symmetrical with respect to a line 4 defined by wall 303 of metallic housing 301. The symmetrical probe ends that extend into resonator cavity 420(2) and resonator cavity 420(9) produce a negative coupling between resonator cavity 420(2) and resonator cavity 420(9). Probe ends 441A and 442A shown in FIG. 4A are substantially 'L' shaped, but this is not necessarily so. For example, probe ends 441B and 442B shown in FIG. 4B are curved. In some embodiments, curved probe ends 441B and 442B may be substantially parallel to a curved surface of a respective dielectric resonator. It will be understood that these example probe ends for providing a negative coupling are merely examples and that other structures may be used with similar effect.

FIGS. 5A and 5B show an example of a partial top view of an RF filter, configured in accordance with some embodiments. The RF filter may be configured to separate, isolate, and output an RF energy signal at a center frequency wavelength 'λ'. The RF filter includes a first resonator cavity 420(2) and a second resonator cavity 420(9) where coupling probe 540A is configured to provide a positive coupling between resonator cavity 420(2) and resonator cavity 420(9).

Coupling probe 540A may be configured such that first probe end 541A and second probe end 542B are asymmetrical with respect to a line 5 defined by the metal wall 303 of metallic housing 301. First probe end 541A extends into resonator cavity 420(2) and second probe end 542A extends into adjacent, non-sequential, resonator cavity 420(9) so as to produce a positive coupling between resonator cavity 420(2) and resonator cavity 420(9). Probe ends 541A and 542A shown in FIG. 5A are substantially "L" shaped, but this is not necessarily so. For example, probe ends 541B and 542B shown in FIG. 5B are curved. In some embodiments, curved probe ends 541B and 542B may be substantially parallel to a curved surface of a respective dielectric resonator. It will be understood that these example probe ends for providing a positive coupling are merely examples and that other structures may be used with similar effect.

Figure 6A:
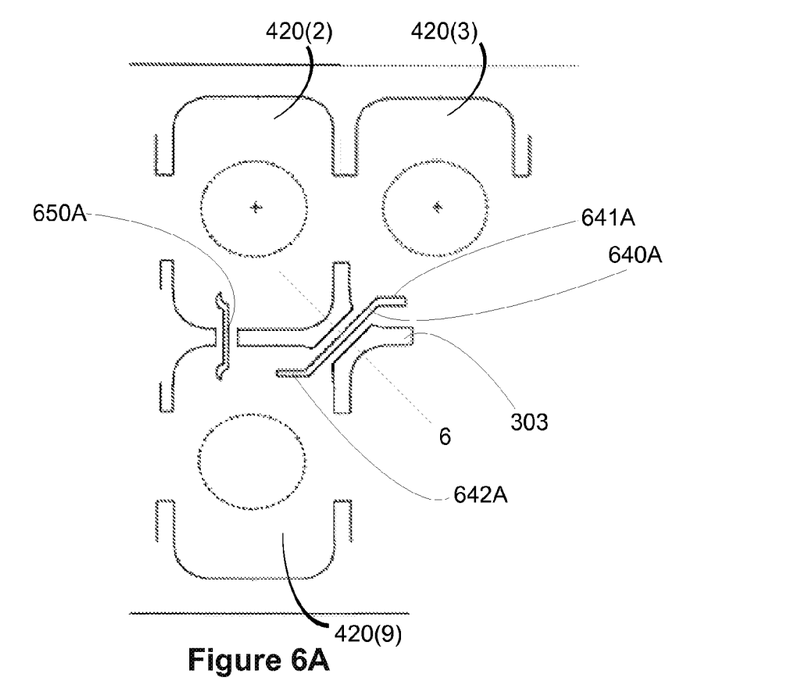
FIG. 6A shows an example of a partial top view of an RF filter including a coupling probe configured to provide a positive coupling between two non-sequential non-adjacent resonator cavities, configured in accordance with some embodiments.

FIG. 6A shows an example of a partial top view of an RF filter, configured in accordance with some embodiments. The RF filter may be configured to separate, isolate, and output an RF energy signal at a center frequency wavelength λ. The RF filter includes a first resonator cavity 420(3) and a second resonator cavity 420(9). Resonator cavity 420(9) is contiguous with, and non-sequential and non-adjacent with respect to resonator cavity 420(3). In the illustrated embodiment, coupling probe 640A is configured to provide a positive coupling between resonator cavity 420(3) and resonator cavity 420(9).

Coupling probe 640A may be configured such that first probe end 641A and second probe end 642A are asymmetrical with respect to a line 6 defined by wall 303 of metallic housing 301. First probe end 641A extends into resonator cavity 420(3) and second probe end 642A extends into contiguous, non-sequential, non-adjacent resonator cavity 420(9) so as to produce a positive coupling between resonator cavity 420(3) and resonator cavity 420(9).

Figure 6B:
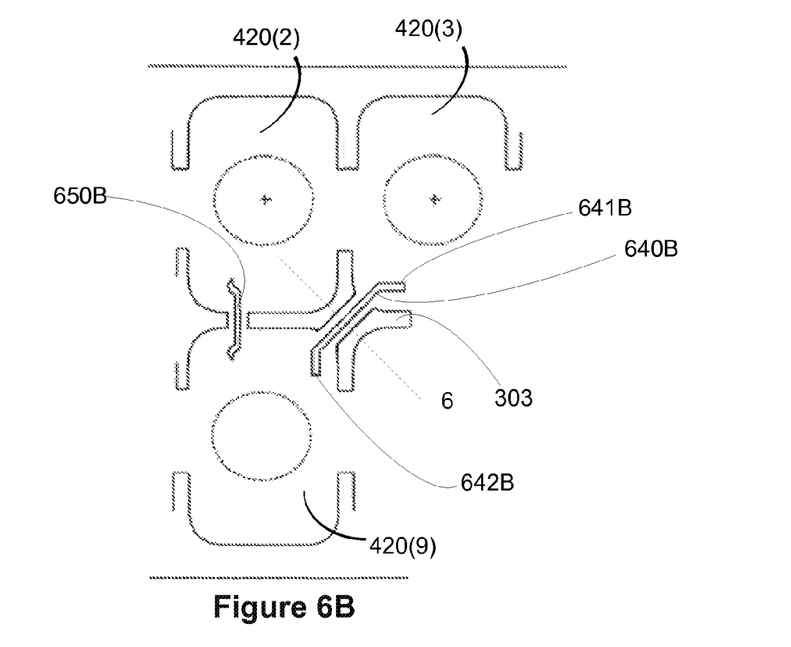
FIG. 6B shows an example of a partial top view of an RF filter including a coupling probe configured to provide a negative coupling between two non-sequential non-adjacent resonator cavities, configured in accordance with some embodiments.

FIG. 6B shows an example of a partial top view of an RF filter, configured in accordance with some embodiments. The RF filter may be configured to separate, isolate, and output an RF energy signal at a center frequency wavelength 'λ'. The RF filter includes a first resonator cavity 420(3) and a second resonator cavity 420(9). Resonator cavity 420(9) is contiguous with, and non-sequential and non-adjacent with respect to resonator cavity 420(3). In the illustrated embodiment, coupling probe 640B is configured to provide a negative coupling between resonator cavity 420(3) and resonator cavity 420(9).

Coupling probe 640B may be configured such that first probe end 641B and second probe end 642B are symmetrical with respect to a line 6 defined by wall 103 of metallic housing 301. First probe end 641B extends into resonator cavity 420(3) and second probe end 642B extends into contiguous, non-sequential, non-adjacent resonator cavity 420(9) so as to produce a negative coupling between resonator cavity 420(3) and resonator cavity 420(9).

In some embodiments, a multi-cavity RF filter may be configured such that a resonator cavity may be coupled with more than one other resonator cavity. For example, referring again to FIG. 6A, resonator cavity 420(9) may be coupled with resonator cavity 420(3) by coupling probe 640A and also coupled with resonator cavity 420(2) by coupling probe 650A. It will be appreciated that one resonator cavity of a multi-cavity RF filter may be coupled with any other resonator cavity proximate thereto with coupling probes. For example, referring now to FIG. 3A, resonator cavity 420(2) may be coupled with one or more of contiguous resonator cavities 420(1), 420(3), 420(10), 420(9), and 420(8) using coupling probes. Each of the coupling probes may be arranged to provide a positive or negative coupling, depending on the desired characteristics of the RF filter.

Figure 7A:
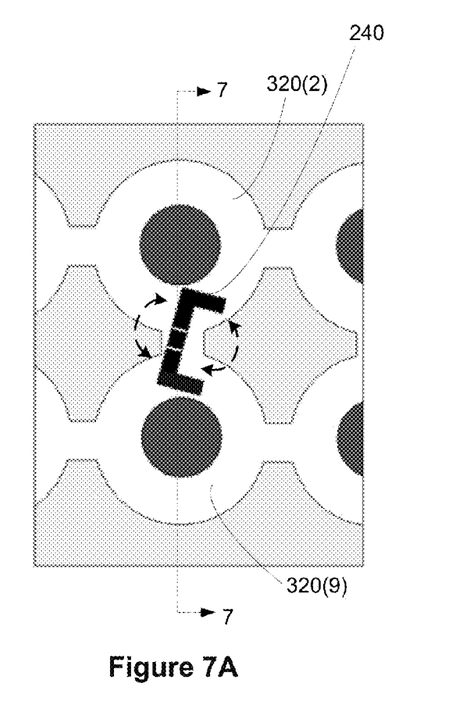
FIG. 7A shows an example of a partial top view of an RF filter, configured in accordance with some embodiments.
Figure 7B:
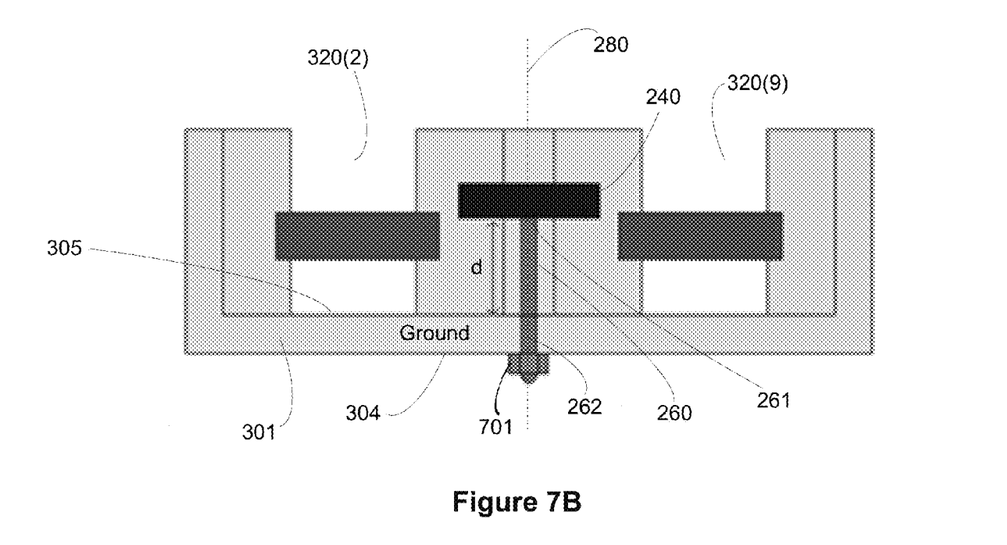
FIG. 7B shows an example of a cross sectional view of the RF filter depicted in FIG. 7A taken along line 7 in FIG. 7A looking in the direction of the arrows, configured in accordance with some embodiments.

FIGS. 7A and 7B show an RF filter including coupling probe 240 with an adjusting device 701, configured in accordance with some embodiments. Specifically, FIG. 7A shows a top view of an RF filter including first resonator cavity 320(2) and second resonator cavity 320(9). FIG. 7B shows a cross sectional view of the RF filter taken along line 7 in FIG. 7A looking in the direction of the arrows.

In some embodiments, second end 262 of post 260 is attached to metallic housing 301 with external adjusting device 701. Advantageously, adjusting device 701 may be disposed such that rotation of post 260 with respect to adjusting device 701 and/or metallic housing 301 may be affected from the exterior of metallic housing 301. As a result, adjusting or "tuning" of coupling probe 240 may be accomplished from the outside of the RF filter.

For example, referring now to FIG. 7A, coupling probe 240 may be configured such that adjusting device 701 is accessible from outside external wall 304. In an embodiment, rotating adjusting device 701 may cause coupling probe 240 to be rotated about longitudinal axis 280. The rotation may be in a clockwise or counter-clockwise direction. As a result, fine tuning of an orientation of coupling probe 240 for a more desirable filter output may be accomplished even after the RF filter has been manufactured and assembled.

As a further example, adjusting device 701 may be configured such that a distance 264 between coupling probe 240 and housing surface 305 may be adjusted, from the exterior of metallic housing 301. For example, rotation of adjusting device 701 may cause coupling probe 240 to be raised or lowered with respect to housing surface 305 such that distance 'd' between coupling probe 240 and housing surface 305 is increased or decreased. In one example, this may be accomplished with second end 262 of post 260 being a threaded screw and adjusting device 701 being a threaded nut. As discussed above, length 'd' may be adjusted in view of factors such as the center frequency wavelength 'λ' of the RF filter or the value of 'n' in the equation, $d=\lambda/4+\lambda*n/2$.

In some embodiments, adjusting device 701 may be controlled by an electronic device within a spacecraft in which the RF filter is disposed. In another example, the electronic device may be in communication with a terrestrial controller device. As a result, fine tuning of the coupling probe even after the spacecraft has been launched into space may be enabled.

Figure 8:
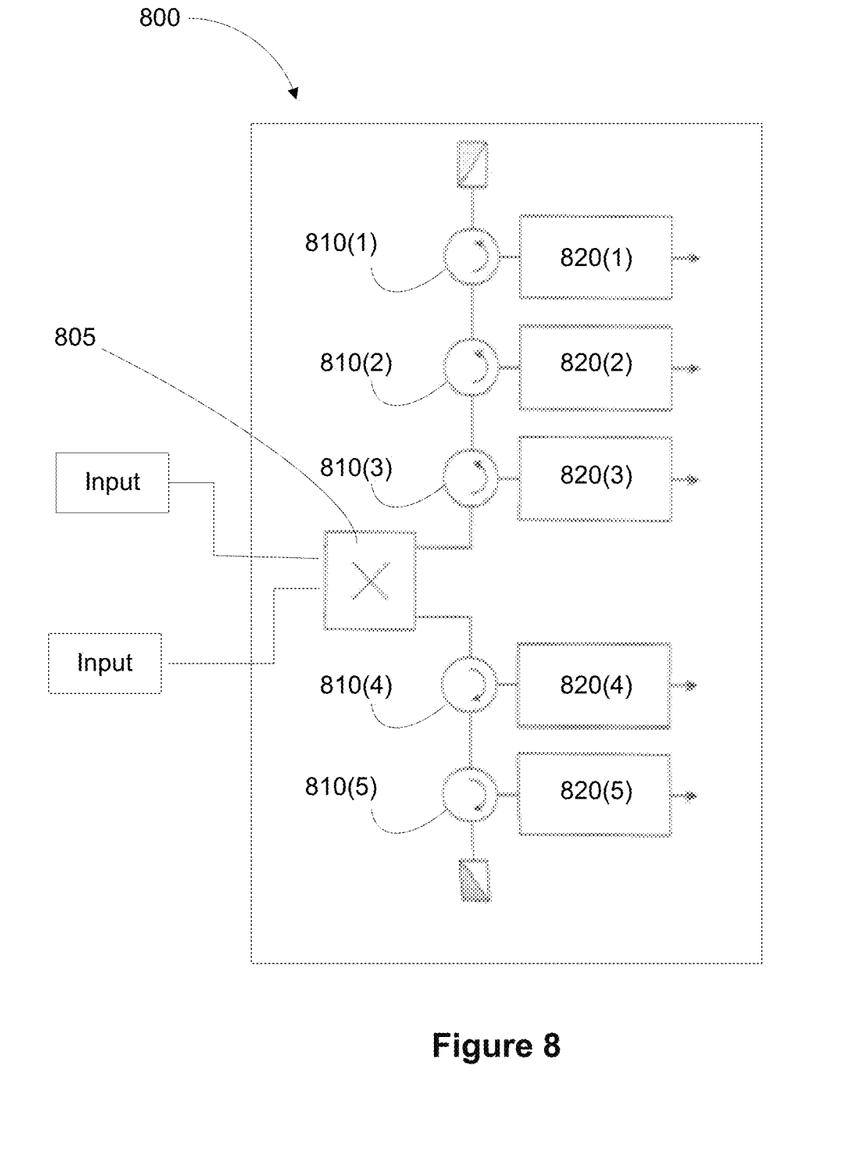
FIG. 8 shows an example of a multiplexer, configured in accordance with some embodiments.

FIG. 8 shows an example of an input multiplexer 800, configured in accordance with some embodiments. Input multiplexer 800 may include hybrid 805 configured to receive input RF energy from one or more receivers. For example inputs from an operational receiver and a redundant receiver may be received by hybrid 805. In an embodiment hybrid 805 may be a 3-dB hybrid. In the illustrated embodiment, input multiplexer 800 includes five channel filters 820(1), 820(2), 820(3), 820(4), and 820(5), however a smaller or larger number of channel filters may be contemplated. Between hybrid 805 and each channel filter 820 may be disposed a respective circulator 810.

Each channel filter 820(i) may be configured to output RF energy at a respective wavelength $\lambda_i$. For example, channel filter 820(1) may be configured to output RF energy at a wavelength $\lambda_1$.

One or more of the respective channel filters 820 may be a multi-cavity RF filter configured as described hereinabove. More particularly, one or more of channel filters 820 may include at least one coupling probe with ESD protective arrangement as described with reference to FIGS. 2-7 above.

While various embodiments have been described herein, it should be understood that they have been presented by way of example only, and not limitation. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A radio frequency (RF) filter, configured to output RF energy at a center frequency wavelength λ, the RF filter comprising:
a multi-cavity metallic housing, the housing comprising a plurality of walls that define a plurality of resonator cavities;
the walls between adjacent sequential resonator cavities having openings configured to couple adjacent sequential resonator cavities;
at least one electrically conductive coupling probe disposed through an aperture of a wall between a first resonator cavity and a second resonator cavity, the coupling probe having opposite probe ends comprising a first probe end extending into the first resonator cavity and a second probe end extending into the second resonator cavity so as to couple RF energy between the first resonator cavity and the second resonator cavity; and
an electrostatic discharge (ESD) protective arrangement, the ESD protective arrangement being configured to provide a low resistance electrical path by way of an electrically conductive post extending from a central portion of the coupling probe to the metallic housing; wherein:
the electrically conductive post is disposed between and external to the first resonator cavity and the second resonator cavity and is configured to provide a high impedance, between the coupling probe and the metallic housing, to RF energy having wavelengths proximate to λ.

2. The RF filter of claim 1, wherein an electrical insulator separates the coupling probe from the wall proximate to the aperture.

3. The RF filter of claim 1, wherein the electrically conductive post includes a first end and a second end, the electrically conductive post being electrically connected, proximate to the first end, to the coupling probe, and electrically connected, proximate to the second end, to the metallic housing, such that a distance 'd' between the coupling probe and the metallic housing is approximately $\lambda/4+\lambda*n/2$, wherein n is a positive integer or zero.

4. The RF filter of claim 3, wherein a longitudinal axis of each resonator is substantially parallel to a longitudinal axis of the post.

5. The RF filter of claim 4, wherein the first probe end and the second probe end are each disposed in a plane substantially orthogonal to the longitudinal axis of the post.

6. The RF filter of claim 4, wherein the second end of the post is mechanically attached to an external wall of the metallic housing.

7. The RF filter of claim 3, wherein one or each of the first probe end and the second probe end is substantially 'L'-shaped.

8. The RF filter of claim 3, wherein one or each of the first probe end and the second probe end is curved.

9. The RF filter of claim 3, wherein the first resonator cavity and the second resonator cavity are adjacent and non-sequential.

10. The RF filter of claim 3, wherein the first resonator cavity and the second resonator cavity are contiguous, non-adjacent, and non-sequential.

11. The RF filter of claim 3, wherein 'n' is zero.

12. The RF filter of claim 3, wherein the ESD protective arrangement further comprises an adjusting device configured to enable adjusting, from the exterior of the metallic housing, one or both of an orientation of the coupling probe and the distance 'd'.

13. The RF filter of claim 1, wherein the coupling probe is configured to provide a positive coupling between the first resonator cavity and the second resonator cavity.

14. The RF filter of claim 1, wherein the coupling probe is configured to provide a negative coupling between the first resonator cavity and the second resonator cavity.

15. The RF filter of claim 1, wherein at least one of the resonator cavities includes a dielectric resonator.

16. The RF filter of claim 1, wherein at least one of the resonator cavities is configured as a coaxial resonator.

17. An improved radio frequency (RF) filter configured to output RF energy at a center frequency wavelength 'λ', the RF filter having a multi-cavity metallic housing, the housing comprising a plurality of walls that define a plurality of resonator cavities; the walls between adjacent sequential resonator cavities having openings configured to couple adjacent sequential resonator cavities; and at least one electrically conductive coupling probe disposed through an aperture of a wall between a first of said resonator cavities and a second of said resonator cavities, the coupling probe having opposite probe ends comprising a first probe end extending into the first resonator cavity and a second probe end extending into the second resonator cavity so as to couple RF energy between the first resonator cavity and the second resonator cavity; wherein the improvement comprises:

an electrostatic discharge (ESD) protective arrangement, the ESD protective arrangement being configured to provide a low resistance electrical path by way of an electrically conductive post extending from a central portion of the coupling probe to the metallic housing; wherein:

the electrically conductive post is disposed between and external to the first resonator cavity and the second resonator cavity and is configured to provide a high impedance, between the coupling probe and the metallic housing, to RF energy having wavelengths proximate to $\lambda$.

18. The improved RF filter of claim 17, wherein an electrical insulator separates the coupling probe from the wall proximate to the aperture.

19. The improved RF filter of claim 17, wherein the electrically conductive post includes a first end, the electrically conductive post being electrically connected, proximate to the first end, to the coupling probe, and electrically connected, proximate to the second end, to the metallic housing, such that a distance 'd' between the coupling probe and the metallic housing is approximately $\lambda/4+\lambda*n/2$, wherein 'n' is a positive integer or zero.

20. The improved RF filter of claim 19, wherein the ESD protective arrangement further comprises an adjusting device configured to enable adjusting, from the exterior of the metallic housing, one or both of an orientation of the coupling probe and the distance 'd'.

21. A multiplexer comprising:
at least two channel filters, wherein:
the multiplexer is configured to channelize an input radio frequency (RF) band of electromagnetic energy into a set of output channels by way of the channel filters, each output channel configured to output RF energy at a respective wavelength $\lambda_i$;
at least one output filter comprising:
a multi-cavity metallic housing, the housing comprising a plurality of walls that define a plurality of resonator cavities;
the walls between adjacent sequential resonator cavities having openings configured to couple adjacent sequential resonator cavities;
at least one electrically conductive coupling probe disposed through an aperture of a wall between a first of said resonator cavities and a second of said resonator cavities, the coupling probe having opposite probe ends comprising a first probe end extending into the first resonator cavity and a second probe end extending into the second resonator cavity so as to couple RF energy between the first resonator cavity and the second resonator cavity; and
an electrostatic discharge (ESD) protective arrangement, the ESD protective arrangement being configured to provide a low resistance electrical path by way of an electrically conductive post extending from a central portion of the coupling probe to the metallic housing; wherein:
the electrically conductive post is disposed between and external to the first resonator cavity and the second resonator cavity and is configured to provide a high impedance, between the coupling probe and the metallic housing, to RF energy having wavelengths proximate to $\lambda$.

22. The multiplexer of claim 21, wherein an electrical insulator separates the coupling probe from the wall proximate to the aperture.

23. The multiplexer of claim 21, wherein the an electrically conductive post includes a first end and a second end, the electrically conductive post being electrically connected, proximate to the first end, to the coupling probe, and electrically connected, proximate to the second end, to the metallic housing, such that a distance 'd' between the coupling probe and the metallic housing is approximately $\lambda/4+\lambda*n/2$, wherein n is a positive integer or zero.

24. The multiplexer of claim 23, wherein 'n' is zero.

25. The multiplexer of claim 23, wherein the ESD protective arrangement further comprises an adjusting device configured to enable adjusting, from the exterior of the metallic housing, one or both of an orientation of the coupling probe and the distance 'd'.

* * * * *